SEMICONDUCTING DEVICES AND METHODS OF PREPARATION THEREOF

Filed Jan. 27, 1959 2 Sheets-Sheet 1

INVENTOR.
HENRY S. SOMMERS, JR.
BY
W.S. Hill
AGENT

April 28, 1964 H. S. SOMMERS, JR 3,131,096

SEMICONDUCTING DEVICES AND METHODS OF PREPARATION THEREOF

Filed Jan. 27, 1959 2 Sheets-Sheet 2

INVENTOR.
HENRY S. SOMMERS, JR.
BY
W. S. Hill
AGENT

3,131,096 SEMICONDUCTING DEVICES AND METHODS OF PREPARATION THEREOF

Henry S. Sommers, Jr., Princeton, N.J., assignor to Radio Corporation of America, a corporation of Delaware Filed Jan. 27, 1959, Ser. No. 789,286
10 Claims. (Cl. 148—33)

Figure 1:
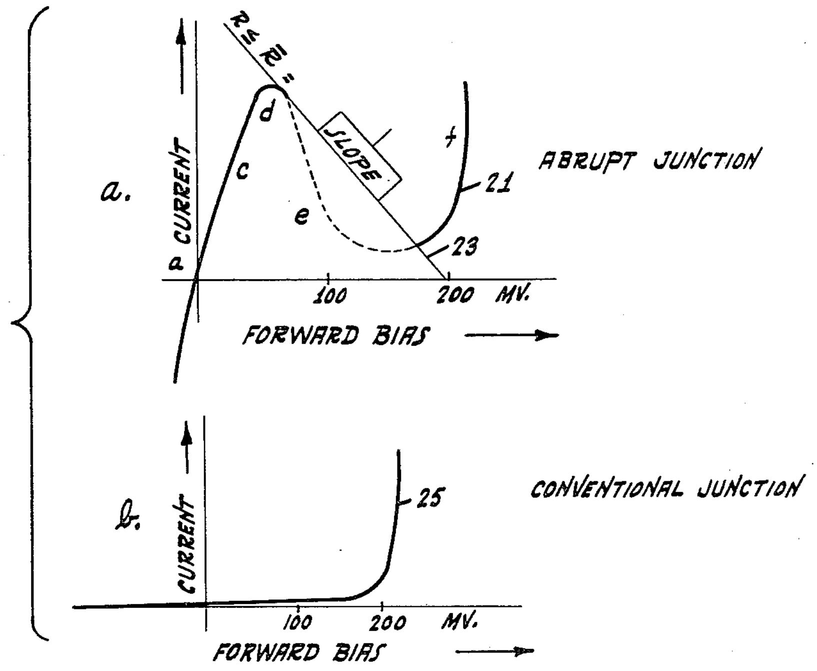

This invention relates to improved semiconducting devices and particularly to improved thin or abrupt junction diodes exhibiting a negative resistance over a region of low forward bias voltages and to methods of preparation of such devices.

As used herein, an abrupt junction refers to a p-n junction which is very thin; i.e., the dimension of the transition region from p to n is less than 200 A. Because of this short dimension in the devices herein, and also because the free charge carrier concentration on both sides of the junction is very high, many of the ordinary characteristics of p-n junctions appear to be changed.

The terms "valence band" and "conduction band" are used in a conventional sense herein and also include a continuum of states in the band gap of the semiconductor near each of these bands as well as such a continuum of states on the surface of the semiconductor. These definitions apply to the semiconductors herein which have relatively high free charge carrier concentrations compared with semiconductors conventionally used. The definitions are intended to include those regions in the band gap which behave in many respects like one of the bands.

Leo Esaki, Physical Review, vol. 109, page 603, 1958, discloses that a negative resistance characteristic was observed at low forward voltages, i.e., less than 0.3 volt, with an abrupt p-n junction in germanium. This diode was prepared with a semiconductor having a free charge carrier concentration several orders of magnitude higher than that used in conventional diodes. Specifically, the junction was prepared by an alloying technique and had an acceptor, and hence free hole, concentration on the p-type side of $1.6\times10^{19}$ cm.$^{-3}$ and a donor, and hence free electron, concentration on the n-type side of $1.0\times10^{19}$ cm$^{-3}$. With no bias applied, the Fermi level on the p side of the p-n junction is in the valence band, while the Fermi level on the n side of the p-n junction is in the conduction band. The diode conducts electric current in the forward direction by two processes: by quantum mechanical tunneling of charge carriers through the depletion region of the p-n junction; and by charge carriers passing over the barrier of the p-n junction.

As the bias voltage is increased from zero in the forward direction, the current through the device due to tunneling rises to a maximum and then falls to zero. The rise and fall of current due to tunneling occurs over a short range of forward bias voltage; generally less than one volt, and provides a negative resistance characteristic to the device. The current in the forward direction due to charge carriers passing over the barrier of the p-n junction is insignificant at the voltages at which current conduction by tunneling occurs. At higher forward bias voltages, where current conduction by tunneling has essentially stopped, current conduction over the barrier becomes significant.

An object of this invention is to provide improved semiconducting devices and improved methods of preparation thereof.

A further object is to provide improved abrupt junction diodes having a negative resistance characteristic.

In general, the semiconducting devices herein comprise a single crystal of semiconductor material and an abrupt p-n junction in operative relationship therewith, the regions on both sides of the p-n junction having very high free charge carrier concentrations.

It has now been found that the negative resistance characteristic due to quantum mechanical tunneling may be produced in semiconductors other than germanium, thereby allowing a high degree of flexibility of design. Thus, by a proper selection of the semiconductor, diodes may be designed to operate in a range of temperatures between that of liquid helium and about 500° C. Other characteristics that may be tailored are: cut-off frequency, gain-bandwidth product, and speed of response.

The negative resistance characteristic is produced where the diode has a value between $10^{-2}$ and $10^{-12}$ for the factor $$\exp. (-aV_{cd}[\epsilon m^{+}/n]^{1/2})$$

wherein:

$V_{cd}$ is the band gap of the material in electron volts.

$m^{+}$ is the ratio of the effective mass of the lighter free charge carrier in the semiconductor to the mass of a free electron (no dimension).

$n$ is the number of free charge carriers per cm.$^3$ on the side of the junction with the lower free charge carrier concentration.

$\epsilon$ is the ratio of the dielectric constant of the semiconductor to the dielectric constant of a vacuum.

$a$ is $7\times10^{10}$.

In the preferred embodiments, the semiconductors have a moderate band gap, have free charge carriers of small effective mass, and both sides of the junction are doped (i.e., contain conductivity type determining impurities) almost to the point where the semiconductor becomes polycrystalline. The high impurity content is necessary in order to provide a very high concentration of free charge carriers. Preferred semiconductors and the lower limit of free charge carrier concentration on the side of the junction with the lower free charge carrier concentration of diodes exhibiting the negative resistance characteristic herein are:

| | |
|---|---|
| Silicon | $2.8\times10^{19}$ cm.$^{-3}$. |
| Gallium arsenide | $0.5\times10^{19}$ cm.$^{-3}$. |
| Indium antimonide | $0.005\times10^{19}$ cm.$^{-3}$. |

As a practical matter the upper limit of free charge carrier concentration in each case is the point at which the semiconductor becomes polycrystalline. There is no theoretical upper limit.

It has further been found unexpectedly that when the free charge carrier concentration on the side of the junction with lower free charge carrier concentration is increased several times above the lower limit; the speed of response and gain bandwidth product of the devices are improved by several orders of magnitude so that the devices may operate at ultra high frequencies, for example, above 10 megacycles per second. In many cases, the devices may operate at 10 to 1000 times that frequency or more. The preferred semiconductors and the range of free charge carrier concentration for ultra high frequencies are:

| | |
|---|---|
| Germanium | 2.0 to $10.0\times10^{19}$ cm.$^{-3}$. |
| Silicon | 7.0 to $35.0\times10^{19}$ cm.$^{-3}$. |
| Gallium arsenide | 3.5 to $17.5\times10^{19}$ cm.$^{-3}$. |
| Indium phosphide | 0.03 to $10.0\times10^{19}$ cm.$^{-3}$. |

The methods of the invention comprise the usual methods for fabricating alloy p-n junctions with semiconductor crystals except that the heating and cooling times for alloying are as short as possible, and the alloying temperature is as low as possible, in order to produce as abrupt a junction as possible. Preferably, the heating is carried on at temperatures between 200° C. and 550° C. for periods of time less than five minutes.

The invention is described in greater detail in the following description when read in conjunction with the drawing in which:

FIGURES 1*a* and 1*b* are graphs comparing the voltage-current characteristic of the junction diode herein with conventional junction diodes.

Figure 2:
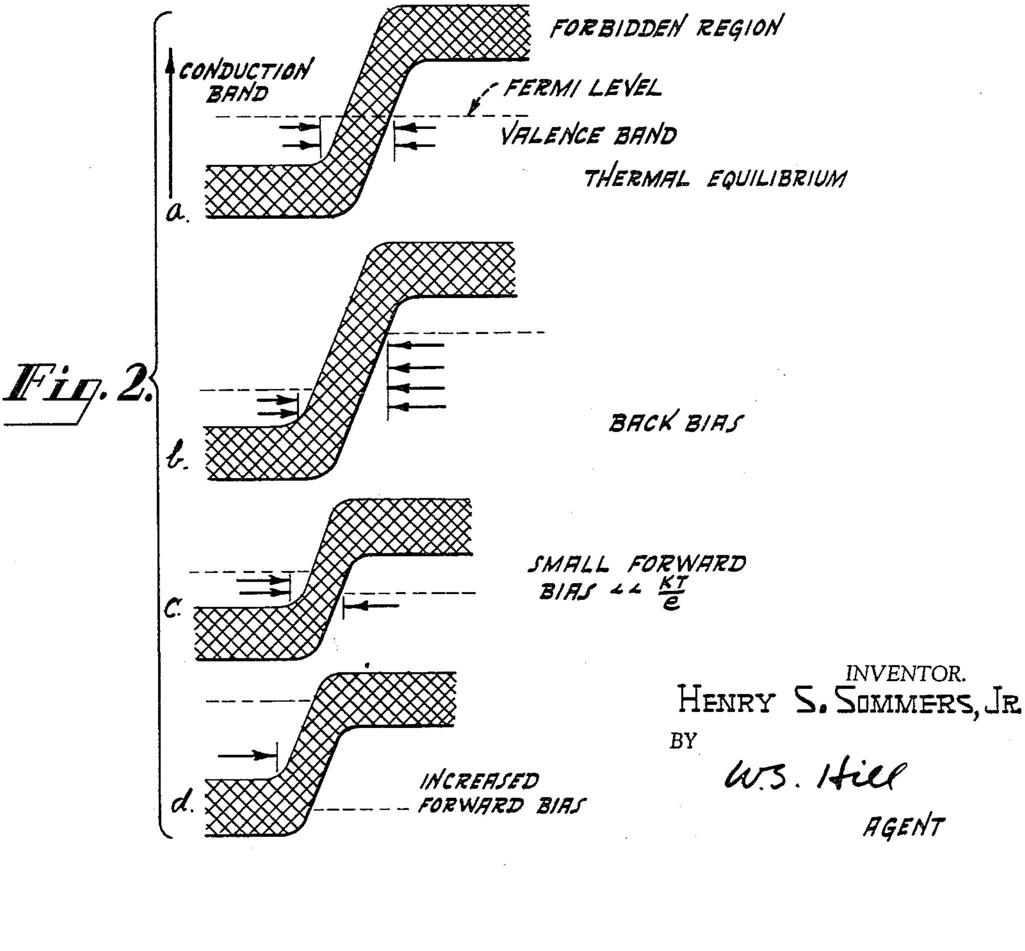
Figure 3:
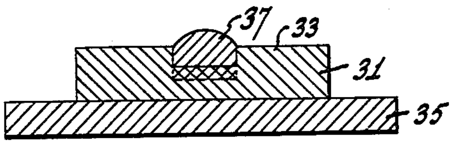
Figure 4:
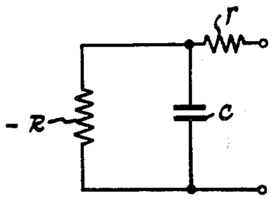
Figure 5:
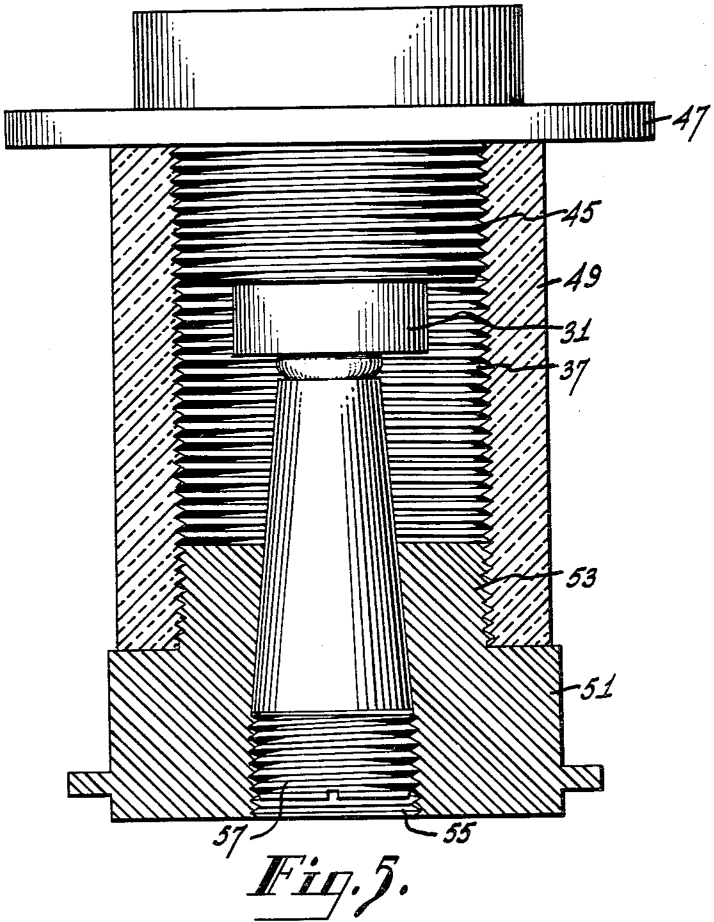

FIGURES 2*a* to 2*d* are energy level diagrams to aid in presenting a theory to account for the negative resistance of the device herein, FIGURE 3 is a sectional view of a typical device of the invention, FIGURE 4 is a proposed equivalent circuit of the device of the example, and FIGURE 5 is a partially sectional elevational view of a mounting designed for improved high frequency operation of a diode herein.

*Example.*—FIGURE 3 shows a sectional view of a typical device herein which may be fabricated as follows: A single crystal bar of n-type germanium is doped with arsenic to have a donor concentration of $4.0\times10^{19}$ cm.$^{-3}$ by methods conventional in the semiconductor art. This may be accomplished, for example, by pulling a crystal from molten germanium containing the requisite concentration of arsenic. A wafer 31 is cut from the bar along the 111 plane, i.e., a plane perpendicular to the 111 crystallographic axis of the crystal. The wafer 31 is etched to a thickness of about 2 mils with a conventional etch solution. A major surface of this wafer 31 is soldered to a strip 35 of nickel, with a conventional lead-tin-arsenic solder, to provide a non-rectifying contact between the wafer 31 and the strip 35. The nickel strip 35 serves eventually as a base lead. A 5 mil diameter dot 37 of 99 percent by weight indium, 0.5 percent by weight zinc and 0.5 weight percent gallium is placed with a small amount of a commercial flux on the free surface 33 of the germanium wafer 31 and then heated at 450° C. for one minute in an atmosphere of dry hydrogen to alloy a portion of the dot to the free surface 33 of the wafer 31, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ of a solution comprising 600 cm.$^3$ concentrated nitric acid, 300 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot with a low impedance lead.

The device prepared according to the example exhibits the following characteristics:

$\overline{R}$=10 ohms (Ω)
C=50 micromicrofarads (μμf.)
$\overline{R}$C=0.5 millimicrosecond (mμs.)

From this data, the gain-bandwidth product, $G_V\Delta f$, is calculated to be about 300 mc./s., and the highest fundamental frequency at which the lumped parameter circuit oscillates is 180 megacycles per second (mc./s.). In a 50 ohm line, the unit can be switched from the low voltage to the high voltage state or from the high to the low voltage state in less than 2 millimicroseconds (mμ sec). The power dissipation is about 1.5 milliwatts in either the low voltage or high voltage mode. The base lead resistance was less than 0.2 ohm. When packaged in an improved diode mount as described with respect to FIGURE 5, the series inductance is about 0.01 microhenry (μh.).

*Fabrication parameters.*—A parameter which strongly determines the ultimate utility of the diodes herein is the free charge carrier concentration in the semiconductor body. Increases in free charge carrier concentration beyond the value disclosed by Esaki, provide improvements in speed of response which are unexpected in the light of previous experience with semiconducting devices. Thus, increasing the charge carrier concentration in germanium from $2.0\times10^{19}$ cm.$^{-3}$ to $4.0\times10^{19}$ extends the region of operation of the germanium diode herein into the meter and centimeter wavelength regions. There is no theoretical upper limit to the free charge carrier concentration in the semiconductor. Where the desired concentration is attained by incorporation of conductivity type determining impurities, the upper limit is the point at which the semiconductor becomes polycrystalline.

In achieving these high speeds it is important that both sides of the junction have high free carrier concentrations. It is to be understood throughout this application that whenever a free carrier concentration is given it refers to the side of the junction with the lower free charge carrier concentration.

Another parameter which influences the utility of the devices herein is the effective mass of the carriers in the semiconductor body. A semiconductor material with a smaller effective mass of either of its carriers provides increased speed of performance at equivalent free carrier concentration, or equivalent speed at lower free charge carrier concentration. The effective carrier mass is different in different crystal directions. The proper choice of crystal axis, so as to align the junction in a direction taking best advantage of this difference, also helps to increase the speed of the device.

A small dielectric constant and a small bandgap for the semiconductor body material both have the effect of increasing the speed at the same free charge carrier concentration.

In germanium, the free charge carrier concentration in the semiconductor body on the side of the junction with the lower concentration should be greater than $2.0\times10^{19}$ cm.$^{-3}$; for example, between 2.0 and $10.0\times10^{19}$ cm.$^{-3}$. A suitable n-type germanium single crystal may be grown in a conventional way using arsenic or phosphorus as the impurity for the doping of the semiconductor body. Free charge carrier concentrations greater than $2.0\times10^{19}$ can be achieved with either impurity.

In alloying a dot to the semiconductor, impurities of conductivity type opposite to the semiconductor body diffuse into the body providing a p-n junction in the body. In addition, a region is produced adjacent the junction having a very high concentration of free charge carriers of opposite type to that of the body. Further alloying provides a low impedance contact to this region. The abruptness of the junction and the high concentration of free charge carriers on both sides of the junction are important to attaining the negative resistance characteristic of the devices herein.

The abrupt junctions of the diodes herein are calculated to be less than 200 A. in thickness. The more abrupt the junction, the higher the current density due to tunneling and hence the higher the frequency at which the device cuts off. Further, the more abrupt the junction the greater the current due to tunneling for the same dot size. And, the more abrupt the junction the higher the capacitance of the device.

A suitable alloying dot composition for making the rectifying junction with n-type germanium is 99% indium, 0.5% zinc, 0.5% gallium. This alloying composition can be varied without materially changing the speed of performance. For example, the zinc content may be increased or omitted, or the gallium content may be increased. Other suitable alloying compositions for n-type germanium can be made by substituting germanium for the zinc in the alloying dot. This has the advantage of improving the mechanical qualities of the dot and reducing the density of n-type impurity in the recrystallized region. Aluminum may be substituted for gallium.

P-type germanium may be substituted for n-type germanium. A suitable p-type germanium single crystal may be grown in a conventional way using aluminum, gallium, or indium as the impurity for doping the semiconductor body. Where a p-type germanium crystal is used, the alloying dot composition should include a donor impurity such as phosphorus or arsenic. A suitable alloy dot composition is a lead-tin-arsenic alloy.

Other semiconductors may be substituted for germanium as described below particularly silicon and the III-V compounds. A III-V compound is a compound composed of an element from group III and group V of the periodic table of chemical elements, such as gallium arsenide, indium arsenide and indium antimonide. Where III-V compounds are used, the p and n type impurities ordinarily used in those compounds are also used for those purposes in this invention. Thus, sulfur is a suitable n-type impurity and zinc a suitable p-type impurity which is also suitable for alloying.

A diode was prepared with a single crystal of gallium arsenide containing sulfur as an n-type impurity. The free electron concentration was $0.8\times10^{19}$ electron cm.$^{-1}$. An abrupt junction was produced with a 10 mil zinc dot. The gain bandwidth product was measured at about 20 mc./s. The highest fundamental frequency at which the lumped parameter circuit oscillates is about 20 mc./s. The power dissipation is about 50 microwatts in either the low voltage or the high voltage mode.

With germanium, the firing temperature can be varied between 300 and 500° C. with firing times of a few minutes. To reduce the broadening of the junction due to diffusion, the time and temperature of firing should be kept short and low. Heating and cooling should be done rapidly for similar reasons. Atmospheres of dry nitrogen and dry hydrogen have been found suitable.

The alloying can be done directly in one firing, or the alloying dot can be preset by firing at a reduced temperature and then alloyed in a second firing. The alloying dot can be applied dry or with any of several commercial fluxes. To reduce spreading of the dot during alloying, the dot may be applied to an oxidized surface of germanium. To make it easier for the alloying dot to overcompensate the impurity concentration in the semiconductor body, the free surface of the body may be outdiffused for a short time, such as by heating in vacuum for five minutes at 700° C.

Alloying in a preferred direction with respect to the crystallographic axes can improve the time constant of the device because of the anisotropy of the effective mass of the carriers. Thus, alloy junctions in germanium along the 110 face have been found to be faster from a circuit point of view than corresponding junctions along the 100 face.

The basic characteristics are independent of the shape and the area of the junction. The area of the junction determines the power level and impedance, but not the ultimate speed of the device. For very high frequencies, other geometries, such as an annular ring, may help by reducing the skin effect. For fabrication in arrays, other shapes, such as square dots, may lend themselves to easier assembly by printed circuit techniques.

The semiconductor body should be thin to reduce *r*, the series dissipative resistance. Care must also be exercised to make ohmic contact to the semiconductor body and to the dot. Base connection can be made by soldering the germanium to a suitable lead material either in the firing operation or before or after firing. Suitable connection can also be made in a variety of other ways, such as plating, evaporation, or thermal compression bonding.

*Electrical characteristics.*—The I-V characteristic curve 21, of a typical diode herein is shown in FIG. 1*a*, with the average value of the negative slope indicated by the straight line 23. For comparison, a curve 25 for a diode similar except that the junction is broad rather than abrupt is illustrated in FIG. 1*b*. The current scales depend on area and doping of the junction, but representative currents are in the milliampere range.

The negative resistance characteristic may be described as a change, with bias voltage, of the Zener-effect current passing through the barrier. Referring to FIG. 2*a*, it will be seen that for sufficiently degenerate diodes (greater than $10^{19}$ carriers cm.$^{-3}$ in germanium), there will be a copious supply of free carriers at the Fermi level in both the p and n regions. Hence for an abrupt junction there will be the large Zener current indicated by the arrows) passing in both directions through the barrier even though no voltage is applied. Because of detailed balancing, the total current will of course be zero (point *a*, FIG. 1*a*).

FIG. 2*b* shows the condition for a small voltage in the back direction. The displacement of the Fermi level on crossing the junction increases the back current of electrons without changing the forward current. This is because the number of electrons on the right side of the junction which see equal-energy states on the left to which they can tunnel is increased by the back bias, while the states to the right accessible to electrons from the left is but little changed. The characteristic is now in region *b* of FIG. 1*a*. For small forward bias ($\ll KT/e$), the characteristic is symmetrical (FIG. 1*a*, region *c*), though the details of the mechanism differ, FIG. 2*c*. Now the forward current results because the number of electrons on the right which can tunnel back is decreased by the displacement of the Fermi level, while again the forward tunneling is roughly constant.

At higher forward bias, the back current becomes small and the net forward current reaches a maximum (region *d*, FIG. 1). It drops with further increase in voltage as the Fermi level on the left approaches and enters the level of the forbidden region on the right, making the forward tunneling decrease, FIG. 2*d*. This drop continues (FIG. 1*a*, region *e*) until eventually normal injection over the barriers becomes important and the characteristic turns into the usual forward behaviour (region *f*, FIG. 1*a*).

*Equivalent circuit and figure of merit.*—To a first approximation, the unit can be represented by C, the transition capacity of the junction, in parallel with —R, the negative resistance. This is illustrated in FIG. 4. Such a device used as an amplifier has a gain-bandwidth given approximately by $$G_v \Delta F = 1/(2\pi RC) \quad (1)$$

where $G_v$ is the voltage gain and $2\Delta f$ is the bandwidth at half voltage gain. The maximum frequency at which it can oscillate is $$F_m = (R/r)^{1/2}/2\pi RC \quad (2)$$

Here r is the dissipative resistance in the circuit. Both these expressions indicate that the high frequency figure of merit of the unit is limited by a characteristic time constant $1/RC$.

*Material parameters.*—Since the major time constant limiting the high-frequency performance of these diodes is $1/RC$ (RC is independent of the area of the junction), a proper selection of the materials results in highest performance units. The capacity C is the transition region capacity due to the depletion layer. It can be represented by a parallel plate condenser of about 80 A. spacing filled with a material with the dielectric constant of the semiconductor. Since this will vary only as some fractional root of the carrier density, to first order it can be considered constant.

In contrast, R, the negative resistance, is determined by the ease with which the carriers penetrate the barrier by the Zener effect and can vary over many orders of magnitude. The present theory, which is simplified, shows that the probability that a carrier approaching the depletion region will appear on the other side is proportional to the factor $$\exp.\ (-aV_{cd}[\epsilon m^+/n]^{1/2}) \quad (3)$$

This is the same as *e*, the natural logarithm, to the power indicated within the parenthesis. To this approximation one can think of $V_{cd}$ as the bandgap, $m^+$ the effective mass ratio of the lighter carrier, and *n* the number of free charge carriers per unit volume on the side of the junction with the lower free charge carrier concentration, $\epsilon$ is the ratio of the dielectric constant of the semiconductor to the dielectric constant of a vacuum, and $a$ a numerical constant depending on the units. Where $V_{cd}$ is in electron volts and $n$ is in carriers per cm.$^3$, $a$ is $7\times10^{10}$. In the devices herein the value of this factor is between $10^{-2}$ and $10^{-12}$ for these units. Thus, high frequency use favors a body material having a moderate band gap (<2.0 e.v.) and small effectiveness mass. In the germanium diodes studied so far, the value of Equation 3 is about $10^{-8}$, hence a fractional change in the exponent can give orders of magnitude change in R.

TABLE 1

| Semiconductor material | $V_{cd}$ | $\epsilon$ | $m^+$ | $V_{cd}(\epsilon m^+)^{1/2}$ | $n$ |
|---|---|---|---|---|---|
| Ge | .65 | 16 | .15 | 1.0 | $4.0\times10^{19}$ cm.$^{-3}$ |
| Si | 1.1 | 12 | .27 | 1.9 | $1.4\times10^{20}$ cm.$^{-3}$ |
| GaAs | 1.35 | 16 | .06 | 1.3 | $7\times10^{19}$ cm.$^{-3}$ |
| InSb | .18 | 11 | .04 | .12 | $6\times10^{17}$ cm.$^{-3}$ |

The value of $n$ (last column) indicates the free charge carrier concentration for equivalent performance.

The values of $m^+$ for germanium, silicon, and indium antimonide in the above table are taken from Spitzer and Fan, Phys. Rev., 106, 882 (1957), using an extrapolation for $n$ from $7\times10^{17}$/cm.$^3$ to $4\times10^{18}$/cm.$^3$. The value of $m^+$ for gallium arsenide is taken from Barcus, Perlmutter and Callaway, Phys. Rev., 111, 167 (1958), at a value for $n$ of $4\times10^{18}$/cm.$^3$.

Table 1 gives the parameters for the most promising materials for diodes herein. These data are for the highest carrier densities at which information is available. They indicate that InSb is the most promising material for high frequency use. For elevated temperatures, GaAs looks attractive and should be better than silicon. In the last column is shown the doping required to make each material equivalent to present germanium units, which have about $4.0\times10^{19}$ carrier/cm.$^3$.

Another consideration favors GaAs and InSb over Ge and Si. Since the first order Zener effect requires conservation of $k$, the wave propagation vector, the effect is allowed for materials like the first two where the optical absorption at the band edge is allowed, and is forbidden for Ge and Si where the edge absorption does not conserve $k$.

The experimental studies so far completed show a very rapid variation of R with carrier concentration, though not the essentially discontinuous change predicted by Equation 3. An increase in the free carrier density in n-type germanium from 2.5 to $4.0\times10^{19}$/cm.$^3$ reduced the time constant from 100 to 0.5 millimicrosecond. This striking improvement indicates that a further small increase in the impurity concentration in germanium, as well as use of the more favorable parameters of InSb and GaAs, will give dramatic results.

TABLE 2

[All $\times 10^{19}$ cm$^{-3}$]

| Semiconductor material | Lower limit of free charge carrier concentration exhibiting negative resistance | Free charge carrier concentration range for ultra high speeds |
|---|---|---|
| Germanium | 0.8 | 2.0 to 10.0 |
| Silicon | 2.8 | 7.0 to 35.0 |
| Gallium arsenide | 0.5 | 3.5 to 17.5 |
| Indium antimonide | 0.005 | 0.03 to 0.15 |

Table 2 gives the lower limit of free charge carrier concentration exhibiting the negative resistance characteristic described herein, for certain semiconductors. There is also given the range of free charge carrier concentration for attaining ultra high speed and frequency performance in these various semiconductors. Generally, the higher the free charge carrier concentration, the higher the speed. Generally, the free charge carrier concentration in the preferred devices corresponds to the excess conductivity type impurity concentration in the semiconductors. The ranges are for free charge carrier concentrations measured at about the operating temperature of the device. In most cases, the concentration exists at about room temperature. However, in many cases, the concentration is at lower temperatures, as at liquid helium temperatures; or at higher temperatures up to 500° C. The negative resistance characteristic is attained when the free charge carrier concentration is within the ranges of Table 2 regardless of temperature up to the maximum temperature above which normal transistor action is no longer possible in the particular material.

*Performance.*—Performance of a device can be measured by either a study of the figure of merit of the unit or study of its behavior in a circuit. Both approaches have been used on the diodes of the invention. On the recent diodes with increased doping, the figure of merit is so high that the actual performance has been restricted by the instrumentation and circuitry; quoted results are lower limits.

(*a*) *Figure of merit* (*RC time constant*).—The negative resistance of the diode, —R, comes from the slope of the I-V characteristic (FIG. 1). Unfortunately, the characteristic can be studied in the negative resistance region only if the measuring circuit is sufficiently damped to suppress all oscillations, a condition that has been satisfied on only the more sluggish units. Most of the measurements have been of the resistance averaged over the entire negative region as indicated by the straight line in FIG. 1. This gives an upper limit to the absolute value of —R.

By using the diode as an active unit in an oscillating circuit, the capacity can be deduced from the known inductance and natural frequency. The very low diode impedance makes these measurements also difficult, for the circuit usually prefers to oscillate in some lower frequency parasitic mode associated with the lead inductances. In this case the apparent capacity is an upper limit. The result of both measurements is that the observed characteristic time constant is generally larger than the true one and the actual performance of the diode will be better than indicated.

Table 3 shows the effect of carrier concentration on the time constant of the diodes for n-type germanium. Carrier concentrations were determined by Hall and conductivity measurements on sections from three arsenic-doped single crystals. The junctions were perpendicular to the 111 axis. Where more than one dot was alloyed to the same body, the dots are numbered consecutively from one end of the wafer. While R and C both vary with the area of the junction, which was not well controlled, the RC product should only be a function of the doping. As predicted from the theoretical analysis, the time constant changes very rapidly with doping.

(*b*) *Performance in an oscillating circuit.*—Equation 2 shows how the cutoff frequency of a diode of the invention depends on the dissipative resistance $r$ of the diode and oscillating circuit, including the radiation resistance. To reduce $r$ to the limit of the spreading resistance of the junction requires much more careful circuit design than the present studies warrant; the observed frequencies, given in Table 4, are not the ultimate achievable. They are to be regarded as a demonstration that these units perform in a way predicted by the equivalent circuit analysis. In Table 4, $f_m$ is the highest fundamental frequency at which the lumped-parameter circuit was observed to oscillate and $h$ is the highest harmonic detected on the radio receiver. For comparison, the measured gain-bandwidth product, $G_v\Delta f$, is included.

TABLE 3

*Effect of Carrier Concentration on Characteristic Time Constant*

| Unit | | n, doping/cm.$^3$ | R, Ω | C, μμf. | $\overline{R}$C, mμs. |
|---|---|---|---|---|---|
| Xtal-wafer | Dot No. | | | | |
| 1677-44 | 1 | $2.5\times10^{19}$ | 1,100 | 660 | 700 |
| | 2 | ------ | 1,500 | 490 | 700 |
| 1677-45 | 1 | ------ | 1,000 | 700 | 700 |
| | 2 | ------ | 1,300 | 360 | 500 |
| | 3 | ------ | 690 | 780 | 500 |
| 1677-46 | 2 | ------ | 790 | 500 | 350 |
| | 3 | ------ | 1,300 | 370 | 480 |
| | 4 | ------ | 1,050 | 400 | 420 |
| 1677-58 | 2 | ------ | 80 | 1,000 | 80 |
| 1750-C7-1 | 1 | $3.6\times10^{19}$ | 8 | 800 | 6 |
| | 3 | ------ | 45 | 160 | 7 |
| 1750-C7-2 | 1 | ------ | 14 | 940 | 13 |
| 1729-9-1 | 2 | [1] $4\times10^{19}$ | 25 | 200 | 5 |
| 1729-7-3 | 4 | [1] $4.1\times10^{19}$ | 6 | 900 | 5 |

[1] Further refinements in measurements and packaging have shown this material has an $\overline{R}C \leq 0.5$ mμsec.

*Limitations in ultimate performance.*—The semi-quantitative agreement between the probability of tunneling as described in Equation 3 and the change in tunneling resistance with doping, Table 3, gives considerable weight to further speculations about the limitations of the effect for high frequency operation. It seems probable that with germanium, the carrier concentration can be further increased to $10.0\times10^{19}$ cm.$^{-3}$ without encountering impossible material fabrication problems. Such an increase should carry the germanium diodes well into the microwave region. With InSb, development of techniques for making good alloy junctions should produce units so fast that circuit techniques rather than fabrication problems limit the performance. In fact, a limited study of the first-principles of the effect has revealed no fundamental time constant longer than around $10^{-14}$ sec.

TABLE 4

| Unit | | $n$ | $G_v\Delta f$, mc/s. | $f_m$, mc/s. | $h$ |
|---|---|---|---|---|---|
| Xtal wafer | Dot No. | | | | |
| 1677-44-1 | 1 | $2.5\times10^{19}$/cm$^3$ | [1] 0.23 | [1] 21 | ------ |
| | 2 | $2.5\times10^{19}$/cm$^3$ | ------ | ------ | ------ |
| 1729-9-1 | 2 | $4\times10^{19}$ | 32 | 120 | ------ |
| 1750-C7-1 | 1 | $3.6\times10^{19}$ | 26 | 140 | 7 |
| C10-1 | 1 | $3.6\times10^{19}$ | ------ | 170 | 6 |
| | 2 | $3.6\times10^{19}$ | ------ | 170 | ------ |

[1] Dots 1 and 2 operated in push-pull.

The diode of the invention operates best in an impedance region new to electronic devices, being inherently a low impedance element. This results from the fact that the negative resistance occurs over a fixed voltage range, independent of the resistance or capacitance. The R.M.S. swing, V, is a constant independent of the value of R, and the power, $(V^2/R)$, varies inversely as the negative resistance. At the 10 milliwatt level, R is about one ohm.

For very high frequency units, fabrication problems may limit R to even smaller values. The character of the circuit design problem is indicated by Table 5, which shows the junction size needed to keep a reasonable impedance in the higher frequency units prepared as in the example except for junction diameter. For different material performance factors, listed as a gain-bandwidth in the first column, and power and characteristic resistance shown in the second and third columns, we have the required junction diameter in mils in the fourth column.

A unit with a 3 mil dot can be used in a 50 ohm line, though the power level will be a few tenths of a milliwatt. $I_m$, the current necessary to switch the unit from the low-voltage to the high voltage state, is listed in the fifth column; for a 50 ohm unit of the present material this would be 4 ma. In contrast, a 50 mw. unit would have a 60 mil junction, a resistance of 0.2 Ω, and require a one ampere pulse to switch it.

The last two columns give the spreading resistance of the junction for two different resistivities. No problem is expected here except at the very highest frequencies, much beyond the present range.

TABLE 5

*Diode Size and Power for Various Impedances and Performance Factors*

| $G_vB$, mc./s. | P, mw. | R, Ω | Junction diameter, mils | $I_m$, ma. | Spreading resistance—base material resistivity | |
|---|---|---|---|---|---|---|
| | | | | | $10^{-3}$ cm., Ω | $10^{-4}$ cm., Ω |
| 30 | 50 | 0.2 | 60 | 1,000 | $2\times10^{-3}$ | ------ |
| | 10 | 1 | 25 | 200 | $4\times10^{-3}$ | ------ |
| | 0.2 | 50 | 3.5 | 4 | $3\times10^{-2}$ | ------ |
| 100 | 50 | 0.2 | 35 | 1,000 | $3\times10^{-3}$ | ------ |
| | 10 | 1 | 15 | 200 | $7\times10^{-3}$ | ------ |
| | 0.2 | 50 | 2 | 4 | $5\times10^{-2}$ | ------ |
| 1,000 | 50 | 0.2 | 10 | 1,000 | $1\times10^{-2}$ | ------ |
| | 10 | 1 | 4.5 | 200 | $2\times10^{-2}$ | ------ |
| | 0.2 | 50 | 0.5 | 4 | $2\times10^{-1}$ | ------ |
| 10,000 | 50 | 0.2 | 3.5 | 1,000 | $3\times10^{-2}$ | ------ |
| | 10 | 1 | 1.5 | 200 | $7\times10^{-2}$ | ------ |
| | 0.2 | 50 | 0.2 | 4 | $5\times10^{-1}$ | ------ |
| 100,000 | 50 | 0.2 | 1 | 1,000 | $1\times10^{-1}$ | $1\times10^{-2}$ |
| | 10 | 1 | 0.4 | 200 | $2\times10^{-1}$ | $2\times10^{-2}$ |

*Use.*—The diodes herein offer the possibility of making cheap, low power devices with high frequency performance, non-linear gain, and storage. For instance, they seem well suited for negative-resistance oscillators in the UHF region. In the field of very fast computers they can perform operations of binary logic, they have sufficient gain to drive several stages in parallel, and they can be used for low-power fast-access memory units. Their simple construction offers the possibility of fabrication in two-dimensional arrays, and their small size makes them attractive for microminiaturization.

Among more speculative possibilities are employment in mixers, in distributed amplifiers, in delay lines with gain, and in microwave or millimeter-wave generators. In fact, within the limitation of their gain-bandwidth characteristic, they seem useful over most of the device range.

*Packaging.*—To take advantage of the high speed potential of the diodes herein, extreme care must be given to the type of package. The high capacity per unit area of these diodes, in the range of 1 microfarad per cm.$^2$ and higher, makes them low impedance elements at high frequencies, and the mounting must be consistent with this. Normal mounting techniques using even a short pigtail will incorporate so much series inductance that the unit cannot realize its potential. A good mounting is in a very low inductance diode mount derived from present designs by enlarging the diameter of the connections and shortening them to the absolute minimum. A better design is to mount the diode element directly across a section of micro-strip of suitable characteristic impedance to utilize the negative resistance of the diode. Suitable ministrips are described in D. D. Greig et al., Proceedings of the IRE, 40, 1644 (1952), and F. Assadourian et al., Proceedings of the IRE, 40, 1651 (1952). This method permits complete elimination of series inductance and raises the cut-off frequency to that determined by the RC time constant of the diode itself.

The device of FIGURE 3 is shown mounted in a high frequency package in FIGURE 5. The package comprises a base 45 to which the semiconductor body 31 is soldered. The base 45 is circular and is provided with outside threads and a flange 47. The base 45 is screwed into a cylindrical insulating sleeve 49 having inside threads until the flange 47 bears firmly against the end thereof. A cover 51 having a recessed and threaded portion 53 is screwed into the opposite end of the sleeve 49 until it bears firmly against the end thereof. The cover 51 has a tapered hole through the center thereof. The outer end 55 of the hole is recessed and threaded. A tapered probe 57 having an outside threaded portion is then screwed into the threaded portion of the cover 51 until the probe contacts the alloy dot 37. External connections are made to the exterior sections of the base 45 and the cover 51. The contact may be bonded by heating sufficiently for the alloy dot 37 to wet the tapered probe 57 by a short heating in an oven or by a condenser discharge through the diode. Such a package provides low impedance connection to the diode at frequencies up to about 200 mc./s.

What is claimed is:

1. A device comprising a single crystal body of semiconductor material and an abrupt p-n junction in operative relationship therewith; the Fermi level on the n side of said junction being in the conduction band and the Fermi level on the p side of said junction being in the valence band; said semi-conducting material being a III-V compound, the ratio of the effective mass of the lighter free charge carrier in said semiconducting material to the mass of a free electron being less than 0.15 and the optical absorption at the band edge being allowed; said device being characterized by exhibiting a negative resistance characteristic when biased at low voltages in the forward direction, said characteristic being due to quantum mechanical tunneling of free charge carriers through said p-n junction.

2. The device of claim 1 wherein said semiconducting material is gallium arsenide.

3. The device of claim 1 wherein the semiconducting material is indium antimonide.

4. The device of claim 1 wherein the semiconducting material is indium arsenide.

5. A device comprising a single crystal body of semiconducting gallium arsenide having a free charge carrier concentration greater than $0.5 \times 10^{19}$ cm.$^{-3}$ and an abrupt p-n junction in operative relationship therewith, the ratio of the effective mass of the lighter free charge carrier in said gallium arsenide to the mass of a free electron being less than 0.15; said device being characterized by exhibiting a negative resistance characteristic when biased at low voltages in the forward direction.

6. A device comprising a single crystal body of semiconducting gallium arsenide having a free charge carrier concentration between 3.5 and $17.5 \times 10^{19}$ cm$^{-3}$, an abrupt p-n junction on a surface thereof, and non-rectifying connections attached to each side of said junction, the ratio of the effective mass of the lighter free charge carrier in said gallium arsenide to the mass of a free electron being less than 0.15; said device being characterized by exhibiting a negative resistance characteristic when biased at low voltages in the forward direction.

7. A device comprising a single crystal body of semiconducting gallium arsenide having a free charge carrier concentration between 3.5 and $17.5 \times 10^{19}$ cm.$^{-3}$, an abrupt p-n junction alloyed on a surface thereof, and non-rectifying connections attached to each side of said junction, the semiconductor on the alloyed side of said junction having a free charge carrier concentration at least as high as said body, the ratio of the effective mass of the lighter free charge carrier in said gallium arsenide to the mass of a free electron being less than 0.15; said device being characterized by exhibiting a negative resistance characteristic when biased at low voltages in the forward direction.

8. A device comprising a single crystal body of semiconducting indium antimonide having a free charge carrier concentration greater than $0.005 \times 10^{19}$ cm.$^{-3}$ and an abrupt p-n junction in operative relationship therewith, the ratio of the effective mass of the lighter free charge carrier in said indium antimonide to the mass of a free electron being less than 0.15; said device being characterized by exhibiting a negative resistance characteristic when biased at low voltages in the forward direction.

9. A device comprising a single crystal body of semiconducting indium antimonide having a free charge carrier concentration between 0.03 and $0.15 \times 10^{19}$ cm.$^{-3}$, an abrupt p-n junction on a surface thereof, and non-rectifying connections attached to each side of said junction, the ratio of the effective mass of the lighter free charge carrier in said indium antimonide to the mass of a free electron being less than 0.15; said device being characterized by exhibiting a negative resistance characteristic when biased at low voltages in the forward direction.

10. A device comprising a single crystal body of semiconducting indium antimonide having a free charge carrier concentration between 0.03 and $0.15 \times 10^{19}$ cm.$^{-3}$, an abrupt p-n junction alloyed on a surface thereof, and non-rectifying connections attached to each side of said junction, the semi-conductor on the alloyed side of said junction having a free charge carrier concentration at least as high as said body, the ratio of the effective mass of the lighter free charge carrier in said indium antimonide to the mass of a free electron being less than 0.15; said device being characterized by exhibiting a negative resistance characteristic when biased at low voltages in the forward direction.

References Cited in the file of this patent

UNITED STATES PATENTS

| | | |
|---|---|---|
| 2,843,515 | Statz et al. | July 15, 1958 |
| 2,847,335 | Gremmelmaier et al. | Aug. 12, 1958 |
| 2,870,052 | Rittmann | Jan. 20, 1959 |
| 2,878,152 | Runyan et al. | Mar. 17, 1959 |
| 2,929,753 | Noyce | Mar. 22, 1960 |
| 2,936,256 | Hall | May 10, 1960 |
| 2,938,819 | Genser | May 31, 1960 |
| 2,940,878 | Plaust et al. | June 4, 1960 |

OTHER REFERENCES

Esaki (I): Physical Review, vol. 109, pages 603 and 604 (1958).

Esaki (II): Properties of Heavily Doped Germanium and Narrow p-n Junctions. Paper delivered at the Brussels Conference on Solid State Physics in Electronics and Communication on June 2 to 7, 1958. Reprinted in "Solid State Physics in Electronics and Telecommunications," vol 1, pages 514–523.

Yajima et al.: Journal of the Physical Society of Japan, vol. 13, No. 11, pages 1281–1287, November 1958.

Johnson and McKay: Physical Review, vol. 93, No. 4, February 15, 1954, pages 668–672.

Welker: Zeitschrift für Naturforschung (Periodical for Research in the Natural Sciences), vol. 7A, November 1952, relied on pages 744–749.